United States Patent [19]

Warner et al.

[11] Patent Number: 5,490,912

[45] Date of Patent: Feb. 13, 1996

[54] APPARATUS FOR LASER ASSISTED THIN FILM DEPOSITION

[75] Inventors: Bruce E. Warner, Pleasanton; William McLean, II, Oakland, both of Calif.

[73] Assignee: The Regents of the University of California, Oakland, Calif.

[21] Appl. No.: 251,129

[22] Filed: May 31, 1994

[51] Int. Cl.$^6$ ................................................ C23C 14/34
[52] U.S. Cl. .................. 204/298.02; 204/192.1; 118/726; 118/620
[58] Field of Search ............ 204/298.02, 192.1; 118/620, 716, 726, 720

[56] References Cited

U.S. PATENT DOCUMENTS

| | | | |
|---|---|---|---|
| 4,989,007 | 1/1991 | Nagal et al. | 427/596 X |
| 5,017,277 | 5/1991 | Yoshida et al. | 204/298.02 |
| 5,037,521 | 8/1991 | Nishikawa et al. | 204/298.02 |
| 5,082,545 | 1/1992 | Tanaka et al. | 204/298.02 X |
| 5,158,931 | 10/1992 | Noda et al. | 427/596 X |
| 5,159,169 | 10/1992 | Nishikawa et al. | 204/298.02 X |
| 5,207,884 | 5/1993 | Char et al. | 204/298.02 |
| 5,242,706 | 9/1993 | Cotell et al. | 204/298.02 X |
| 5,264,412 | 11/1993 | Ota et al. | 427/596 X |

*Primary Examiner*—Nam Nguyen
*Attorney, Agent, or Firm*—Henry P. Sartorio

[57] ABSTRACT

A pulsed laser deposition apparatus uses fiber optics to deliver visible output beams. One or more optical fibers are coupled to one or more laser sources, and delivers visible output beams to a single chamber, to multiple targets in the chamber or to multiple chambers. The laser can run uninterrupted if one of the deposition chambers ceases to operate because other chambers can continue their laser deposition processes. The laser source can be positioned at a remote location relative to the deposition chamber. The use of fiber optics permits multi-plexing. A pulsed visible laser beam is directed at a generally non-perpendicular angle upon the target in the chamber, generating a plume of ions and energetic neutral species. A portion of the plume is deposited on a substrate as a thin film. A pulsed visible output beam with a high pulse repetition frequency is used. The high pulse repetition frequency is greater than 500 Hz, and more preferably, greater than about 1000 Hz. Diamond-like-carbon (DLC) is one of the thin films produced using the apparatus.

56 Claims, 8 Drawing Sheets

APPARATUS FOR LASER ASSISTED THIN FILM DEPOSITION

The United States government has rights in this invention pursuant to Contract Number W-7405-ENG-48 between the United States Department of Energy and the University of California for the operation of Lawrence Livermore National Laboratory.

CROSS-REFERENCE TO RELATED APPLICATIONS

METHOD FOR LASER ASSISTED THIN FILM DEPOSITION AT HIGH RATE, U.S. patent application Ser. No. 08/251,130, pending, filed on the same date as the instant application, inventors Bruce E. Warner and William McLean II, assigned to the assignee of the instant application.

BACKGROUND OF THE INVENTION

1. Field of the Invention

This invention relates to an apparatus for producing a thin layer of material on a substrate by laser ablation, and more particularly, to a laser ablation apparatus that includes an optical fiber delivery system to deliver a visible light beam at a high repetition rate.

2. Description of Related Art

A variety of methods have been used to produce thin films of material on substrates. These include ion beam deposition, chemical vapor deposition, plasma enhanced chemical vapor deposition and sputter deposition. Ion beam techniques typically involve producing ions by heating a filament and accelerating electrons through a gas to produce ions that are accelerated towards a substrate in a high vacuum environment. Ion beam systems use differential pumping and mass separation techniques to reduce the level of impurities in the influence to the growing film. Films produced by this method are expensive, limited in variety and have very slow growth rates.

The chemical vapor deposition and plasma enhanced chemical vapor deposition methods are similar in operation and associated problems. Both methods produce collateral products of dissociation that frequently contaminate the growing film. Films produced by these methods have characteristics such as columnar grains and occasional bare spots (holidays) that often make them unsuitable for some of the more demanding commercial uses. These techniques often involve toxic precursors and/or by-products. Additionally, the range of possible products is limited by the availability of suitable gaseous precursors.

Sputtering deposition usually includes one or more ion sources. The poor vacuum and relatively high pressure in sputtering deposition is cumbersome and tends to introduce contamination of the film on a level comparable to those encountered in chemical vapor deposition and plasma enhanced chemical vapor deposition. Because not all elements are sputtered at the same rate, it is often difficult to maintain or control the exact chemical composition of the product material using this technique. This is especially true of complex compounds involving oxides or nitrides.

Pulsed laser deposition of thin films has been demonstrated to be a useful technique for producing a wide variety of thin films on a substrate. Examples include, but are not limited to, high density hard disk coatings, optical coatings, high temperature radiation resistant semiconductors, cutting tool coatings, tribological coatings, heat sinks, field emitters for flat panel displays (FPD's), infrared detectors, low resistivity interconnects for fast switching Schottky rectifiers, high resistivity lubricating and low resistivity lubricating coatings, piezoelectric devices, nonvolatile memories, high temperature wide band gap semiconductors, antireflection coatings, high Tc superconductors, piezoelectric devices and phosphors.

Generally, when using laser deposition techniques, a substrate is coated with a thin film that is generated from a plume of ions and energetic neutral species emanating from a selected target material. A focused pulsed laser beam, usually from a UV source, is incident on the target at a non-perpendicular angle. The deposition is generally performed in a vacuum or selected atmosphere of a reactive gas, such as flowing oxygen or nitrogen. A major advantage of the pulsed laser deposition process is the near stoichiometric transfer from the ablation target to the substrate. This feature is difficult to achieve with other conventional coating technologies. With pulsed laser deposition, minor adjustments to the substrate temperature, and also possibly to the background pressure of reactive gases, result in adherent coatings with acceptable morphologies, correct stoichiometries, and desirable physical properties. Other advantages of laser deposition include a faster deposition rate, the requirement for only a single target, and the ability to deposit materials possessing high boiling point temperatures, such as refractory materials. The ability to select from a wide variety of solid targets with known chemistries and to maintain those chemistries during the coating process, renders laser deposition technologies much more flexible and versatile than other coating technologies.

While pulsed laser deposition offers clear advantages over conventional coating technologies, the current methods and apparatus for practicing pulsed laser deposition have relatively low deposition rates and often introduce macroparticles that have been ejected from the target material. These methods utilize short wavelengths, 193 nm to 308 nm, arriving in pulses 20 to 50 ns wide with peak irradiances of $10^8$ to $10^{11}$ $W/cm^2$ at rates of 5 to 30 Hz and pulse powers in the 10–100 mJ/pulse range. Light at such short wavelengths is difficult to transmit through currently available fiber optics. This limits the flexibility of potential light delivery systems.

Only thin films of very high value are considered economic at present deposition rates which are on the order of about 10 $\mu m$-$cm^2$/h. This low rate coupled with the high cost of the laser system present a major impediment to the ability to utilize pulsed laser deposition in large scale commercialization applications.

Accordingly, there is a need for a pulsed laser deposition method and apparatus that produces thin films, (i) at much faster deposition rates than current methods with potential wide spread commercial applications, (ii) with a minimal presence of macroparticles from the target material, (iii) which use visible light, (iv) that use laser sources positioned at remote locations from the deposition chamber, (v) that employ fiber optics, (vi) which are capable of simultaneously illuminating either a large number of individual positions in one or more deposition chambers, (vii) that make provisions for introducing reactive gases at high pressures between laser pulses but that maintain good vacuum conditions when the laser plume is present and (viii) provide convenient methods for rapidly introducing or exposing fresh target material at a rate to minimize system downtime but maximize film quality.

SUMMARY OF THE INVENTION

An object of the present invention is to provide an apparatus for rapidly producing high volumes of thin films in a laser deposition process with fiber optics and visible light.

Another object of the present invention is to provide an apparatus for producing thin films in a laser deposition process with a plurality of optical fibers that deliver laser energy through multiple windows in a deposition chamber.

Yet another object of the present invention is to provide an apparatus for producing thin films in a laser deposition process with a plurality of optical fibers that deliver laser energy to a plurality of deposition chambers.

Still a further object of the present invention is to provide an apparatus for producing thin films in a laser deposition process with a plurality of optical fibers that receive optical energy from a single laser source.

Another object of the present invention is to provide an apparatus for producing thin films in a laser deposition process with a plurality of optical fibers from more than one laser source.

Yet another object of the present invention is to provide a pulsed laser deposition apparatus that includes a reactive atomic or molecular beam source.

In accordance with a first aspect of the present invention, thin films are produced in a pulsed laser deposition apparatus that includes a laser source producing a visible output beam. A fiber optic delivery system, including a distal end coupled to the laser source, and a proximal end positioned adjacent to a deposition chamber, delivers the output beam to a target material in the chamber. A substrate is supported in the chamber. The visible output beam is incident on the target and produces a directed plume of ions and energetic neutral species. A portion of the plume is deposited on the substrate as a thin film.

In order to protect the window through which the visible light from the laser is transmitted to the target, in the chamber, from build up of coatings from the plume, a window protection device can be included. It can be in the form of a roll of protection sheet material that extends across the window in the chamber that is advanced continuously or periodically to introduce fresh (uncoated) material. The visible output beam can be dithered as it impinges on the target material. The apparatus can also include an atomic or molecular beam source that produces a reactive beam. This beam is directed to the thin film on the substrate. It can be used to scrub the surface of the thin film to remove unwanted chemical constituents or to react with the coating material to produce a desired stoichiometry. It can be pulsed to be in phase or out of phase with the pulsed laser.

The apparatus of the present invention can include a multi-plexed optical fiber delivery system. A plurality of optical fibers can deliver the visible output beam to different sites on the target in the chamber, to multiple targets in the target, or to different chambers. More than one laser source can be employed. With multi-plexing, uninterrupted operation of the laser source can continue because if the operation of one chamber ceases, then the deposition processes in the other chambers can still continue. Introducing multiple beams to a single chamber allows large areas to be coated rapidly, uniformly and economically.

The target support can be a rotating spindle. Alternatively, it can be a rotatable platform that retains a plurality of target samples. The samples can be stacked on the platform. This greatly improves on existing target support systems in that the need to add new target material to the deposition chamber is reduced because there is much more fresh target material available.

An output beam of visible light is used at a high repetition rate. The repetition rate is greater than about 500 Hz, and more preferably, greater than about 1000 Hz. The output beam is pulsed at a low pulse energy, which can be about 2 to 10 millijoules/pulse. Additionally, the output beam has a short pulse length, such as 20 to 50 nanoseconds. Laser irradiance on the target can be less than about $10^{10}$ W/cm$^2$. For optimum film smoothness (quality) it is desirable that the output beam does not strike the same target spot, at any one time, with more than 10 to 20 laser pulses.

With the use of visible light and fiber optic delivery systems, the laser source can be positioned at a remote location relative to the deposition chamber. By remote, it is meant that the laser need not be positioned directly adjacent to the exterior of the chamber.

The collection of the plume, and creation of the thin film, can be enhanced by biasing the substrate holder. In one embodiment of the present invention, a copper vapor laser, operating at 100 W to 200 W average power and 4.3 kHz pulse repetition-rate, produced high quality diamond-like-carbon (DLC) at a rate greater than 2000 μm·cm$^2$/hr.

Applications of the DLC produced by the present invention include, (i) low work function emitters for flat panel displays, (ii) hard low-friction coatings for wear surfaces such as machine tool bits, (iii) low absorptivity coatings for infrared optics, (iv) corrosion resistant coatings for chemical processing systems, and (v) high thermal conductivity coatings for the electronics industry.

DETAILED DESCRIPTION OF THE PREFERRED EMBODIMENTS

Figure 1:
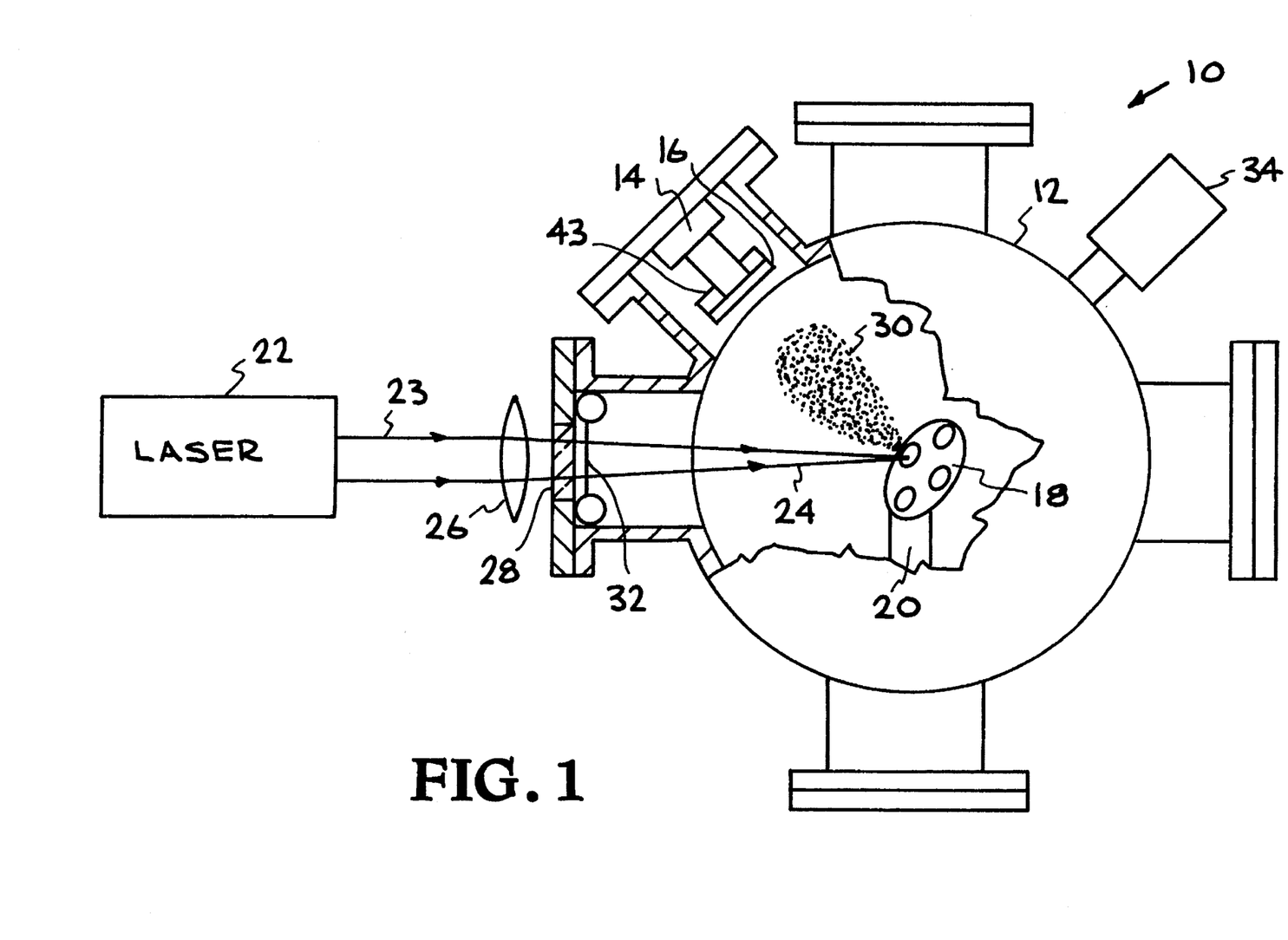
FIG. 1 is a schematic diagram of a deposition chamber for pulsed laser deposition that is used with the present invention.

Referencing FIG. 1, the basic embodiment of the laser ablation system 10 is illustrated. Generally, the system includes a chamber 12, which may or may not be maintained at vacuum conditions depending on the desired product thin film chemistry, a substrate support 14 supporting a substrate 16 to be coated with the thin film, a rotating target 18, a target support 20, a laser source 22, a fiber optic delivery system 23, an output beam of visible light 24, a focus lens assembly 26, and a laser input window 28.

A variety of substrate 16 materials can be used. Examples of suitable materials include but are not limited to $SiO_2$, Si, Si with Cr overlay, tool steel, WC and ZnS.

Laser source 22 produces visible output beam 24. Suitable lasers include copper vapor and a frequency doubled Nd:YAG laser such as Model No. 803, available from Laserscope, San Jose, Calif. Other pulsed laser sources producing visible light at high repetition rates are suitable. Laser source 22 provides pulsed output 24 at a high repetition rate, and can be run in a Q-switched mode. High repetition rate is deemed to be greater than about 500 Hz, and preferably greater than about 1000 Hz up to about 10 kHz. Output beam 24 is pulsed at a low pulse energy, such as in the range of about 2 to 10 millijoules per pulse. Additionally, output beam 24 has a short pulse length of about 20 to 50 nanoseconds.

Output beam 24 passes through a focusing lens 26 and is directed through input window 28. It is incident upon moving target 18 at a non-perpendicular angle, striking target 18 from above at an oblique angle. An ablation plume 30, generally normal to target 18, is a plasma of ions and energetic neutral atoms that coats substrate 16 as a thin film of material. Output beam 24 can be dithered in order to strike numerous sites on target 18. Additionally, output beam 24 can be defocused as it strikes target 18. The irradiance of output beam 24 on target 18 is less than about $10^{10}$ W/cm$^2$, and it is directed at target 18 with not more than about 10 to 20 laser pulses on the same spot.

Target support 20 can be biased to create an accelerating grid to add energy to the ions in plume 30. This reduces stress in substrate 16 and thicker thin films are possible. The creation of the accelerating grid helps substrate 16 adhere to certain materials. The bias can be pulsed so that the timing of the arrival of ions to substrate 16 can be controlled. Additionally, pulsing the bias permits selectivity of the portion of the plume to be accelerated. Ions can be driven in, the bias can be switched from negative to positive, and then electrons can be pulled in to neutralize the surface charge of the thin film on substrate 16.

The majority of the visible wavelength output beam 24 is not absorbed by plume 30. Within 3 or 4 nanoseconds after output beam 24 strikes target 18, the temperature of the spot where the beam strikes is raised and becomes either a liquid or sublimes. Each pulse of light removes only a fraction of a micron of target material 18. By limiting the number of light pulse exposures on any one target location, the generation of large pieces of ejected target material are minimized and the thin film that is created has a substantially uniform surface structure. Small fractions of a micron of target 18 are removed in order to achieve this uniform surface.

Target holder 20 is rotated and also moved in a direction along its longitudinal axis in order to remove only small fractions of target 18 material at any one time. Another embodiment of target holder 20 is described further herein.

Deposition rates of thin film on substrate 16 are much greater than prior pulsed laser deposition methods. Depositions volumes on the order of 1000 μm-cm$^2$/hr are obtained. In many applications the deposition rate is about 2000 μm-cm$^2$/hr.

In order to reduce the need for frequent replacement of input window 28, a window protection system 32 is used. Window protection system 32 can be a roll of protective material, such as mylar, that covers substantially the entire window 28 so that material ejected during the pulsed laser ablation process is not deposited on window 32. The roll of mylar is periodically advanced so that output beam 24 can be directed into chamber 12 without interference. The roll of mylar can be positioned within chamber 12 in order to maintain the desired vacuum conditions. A commercially available 2.5 μm thick mylar film can be continuously advanced past the vacuum side of window 3. It can be refreshed periodically, for example every $5\times10^4$ laser pulses, and does not lead to loss of laser power. A reel-to-reel device for moving fresh film in front on window 32 is suitable and spreads the mylar uniformly to ensure a relatively uniform optical path length through it.

Chamber 12 can be operated at high vacuum, less than about $1\times10^{-6}$ torr, or with a desired atmosphere such as oxygen or nitrogen, depending on the particular thin film. A vacuum source 34, such as a turbomolecular pump, is used to evacuate chamber 12 as needed.

Figure 2:
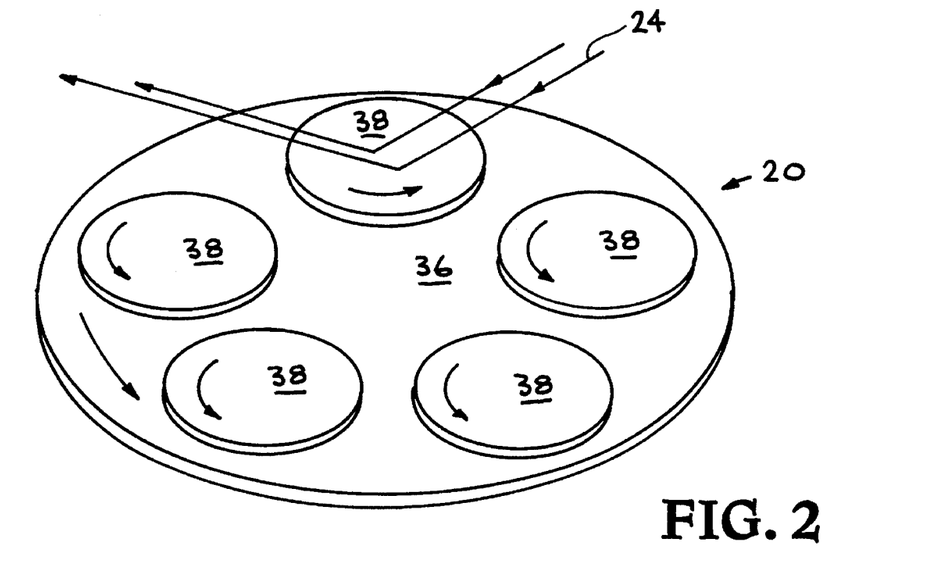
FIG. 2 is a schematic diagram of turntable that supports multiple sections of target material in the deposition chamber.

FIG. 2 illustrates another target support system 20. Included is a platform 36 which supports a plurality of target material sections 38, each of which can be caused to rotate on platform 36. Platform 36, itself, is caused to rotate. Incident output beam 24 strikes each target material section 38 for a desired number of times per pulse, Target material sections 38 also rotate on platform 36. This method introduces a fresh supply of target material without shutting down chamber 12. Additionally, stacks of target material sections 38 can be positioned on platform 20, and advanced up until all useful target surface has been consumed, with the old section swapped out for the next stacked one. This provides for the introduction and removal of a number of different disks of target material, much like that of a commercially available compact disk (CD) player mechanism for introducing CD's.

Figure 3:
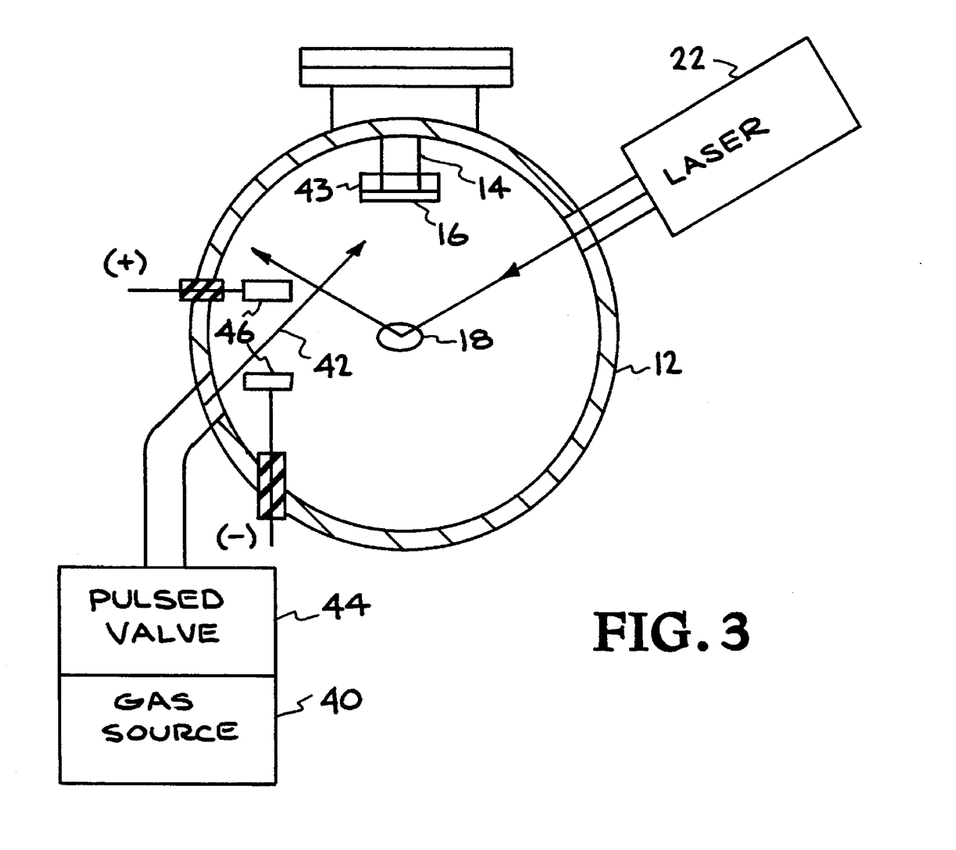
FIG. 3 is a schematic diagram of a pulsed laser deposition chamber with a reactive atomic or molecular beam source.

An atomic or molecular beam can be introduced into chamber 12 as illustrated in FIG. 3. A source of gas 40, for example hydrogen, produces a reactive gas beam 42 which can be pulsed to be in phase or out of phase with pulsed laser 22. Pulsing is achieved by the use of a pulsed valve 44. An arc discharge device 46 can be positioned in chamber 12 to create a discharge. It serves to break molecules into reactive atomic or ionic species. The reactive species help to create a desired surface on the thin film deposited on substrate 16. A microwave cavity or a filament can also be used. When graphite is the selected target material to produce a diamond-like carbon (DLC) thin film, a hydrogen atom beam 42 scavenges graphite from the DLC film. This can be enhanced with modifying the surface temperature of the thin film by use of a substrate heater assembly 43 to heat or cool substrate support 14 in a controled manner.

Reactive gas beam 42 is directed at substrate 16. By pulsing reactive gas beam 42 between laser pulses, the average vacuum in chamber 12 can be maintained at levels sufficient to assure material transport from the target 18 to substrate 16 with or without inducing particle collisions within plume 30. By directing reactive gas beam 42 to substrate 16, local pressures at the surface of substrate 16 are created but these do not affect the general pressure throughout chamber 12. Essentially, the majority of the collisions from reactive gas beam 42 are directed between the thin film on substrate 16 and the reactive gas, such as hydrogen.

In the case of DLC formation, the pulses of reactive gas beam 42 are out of phase with laser 22. However, there are certain applications where it is desirable for the pulses to be in phase. For example, pulsed laser deposition (PLD) is used to deposit high temperature superconductors, which tend to be oxygen deficient. Reactive gas beam 42 can be an oxygen source that is coincident with the deposited high temperature superconductor ceramic. The use of an in phase oxygen reactive gas beam 42 enhances oxygen content of the superconductor. This is achieved with little effect on the overall pressure in chamber 12 because reactive gas beam 42 is again directed to the surface of substrate 16.

Figure 4:
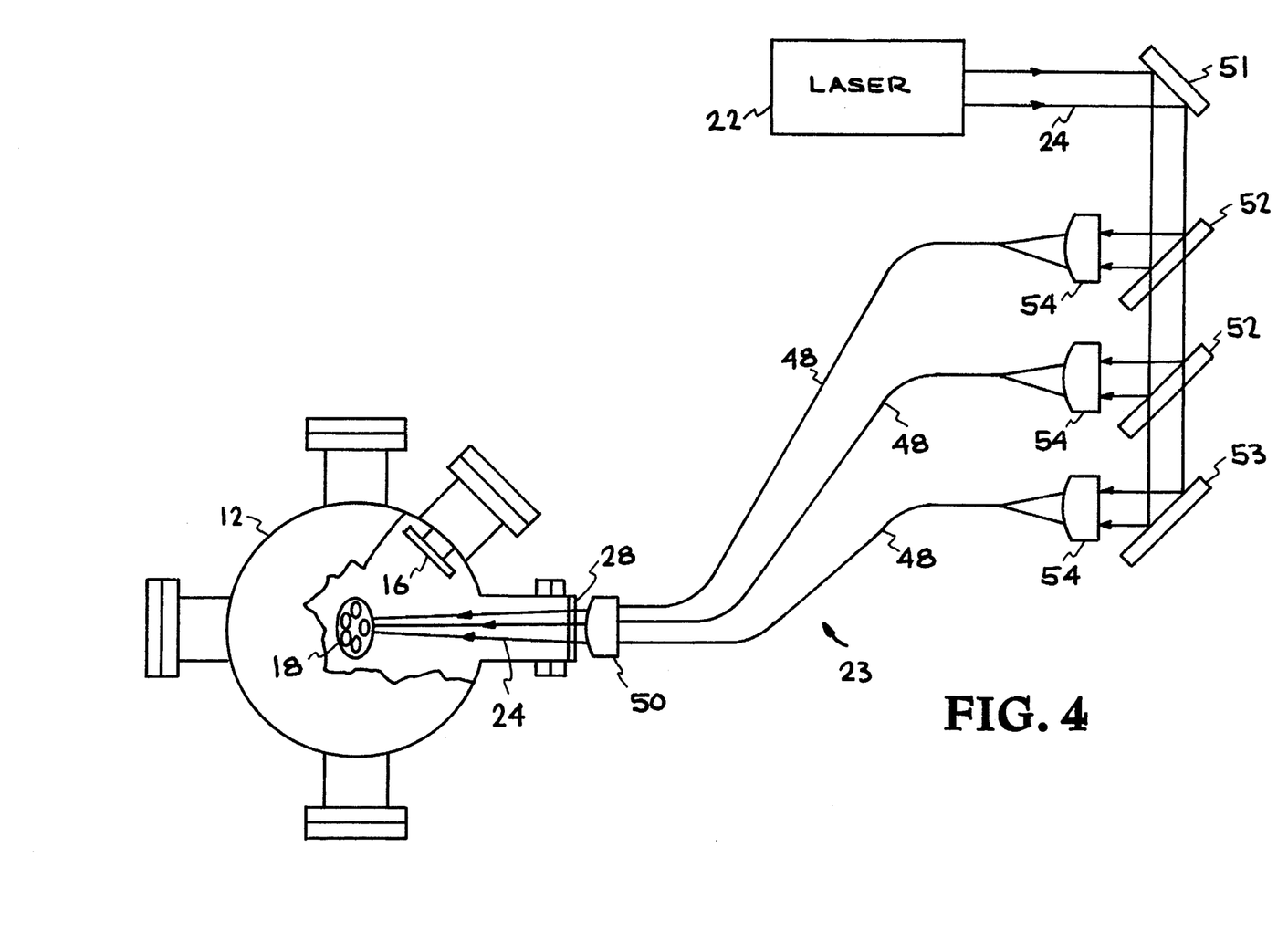
FIG. 4 is a schematic diagram of a fiber optic delivery system with a single deposition chamber and a single laser source.

Fiber optic delivery system 23 can consist of one or more fiber optics, as illustrated in FIG. 4. Each optical fiber 48 is made of a material that transmits high average power visible light, such as fused silica. Optical fibers 48 produce output beam 24 with a homogeneous intensity profile due to a scrambling of all of the modes present in the laser source 22. The result is a spatially uniform light source in the visible region of the spectrum.

Laser 22 can be remote from chamber 12, which means that it is not positioned directly outside of window 28 and that the output light is transmitted without complex optical elements. An end of optical fiber 48 can image output beam 24 to a position on target 18. Optical fiber 48 has a distal end that is coupled to laser 22, and a proximal end that delivers output beam 24 to target 18. The proximal ends of optical fibers 48 can be positioned at least partially within chamber 12, or alternatively, remain outside. With the use of a transfer optic 50 output beam 24 is directed to various sites of target 18. As the output is imaged onto target 18, it can be simultaneously demagnified.

The diameter of optical fiber 48 can vary from 100 to 1000 microns. Preferably, it is in the range of 200 to 600 microns. When a 600 micron fiber is used the output can be reduced to a 300 micron spot with a 2 to 1 reducing imaging telescope. Other reducing imaging telescopes can be used, such as one that reduces from three to one.

Figure 5:
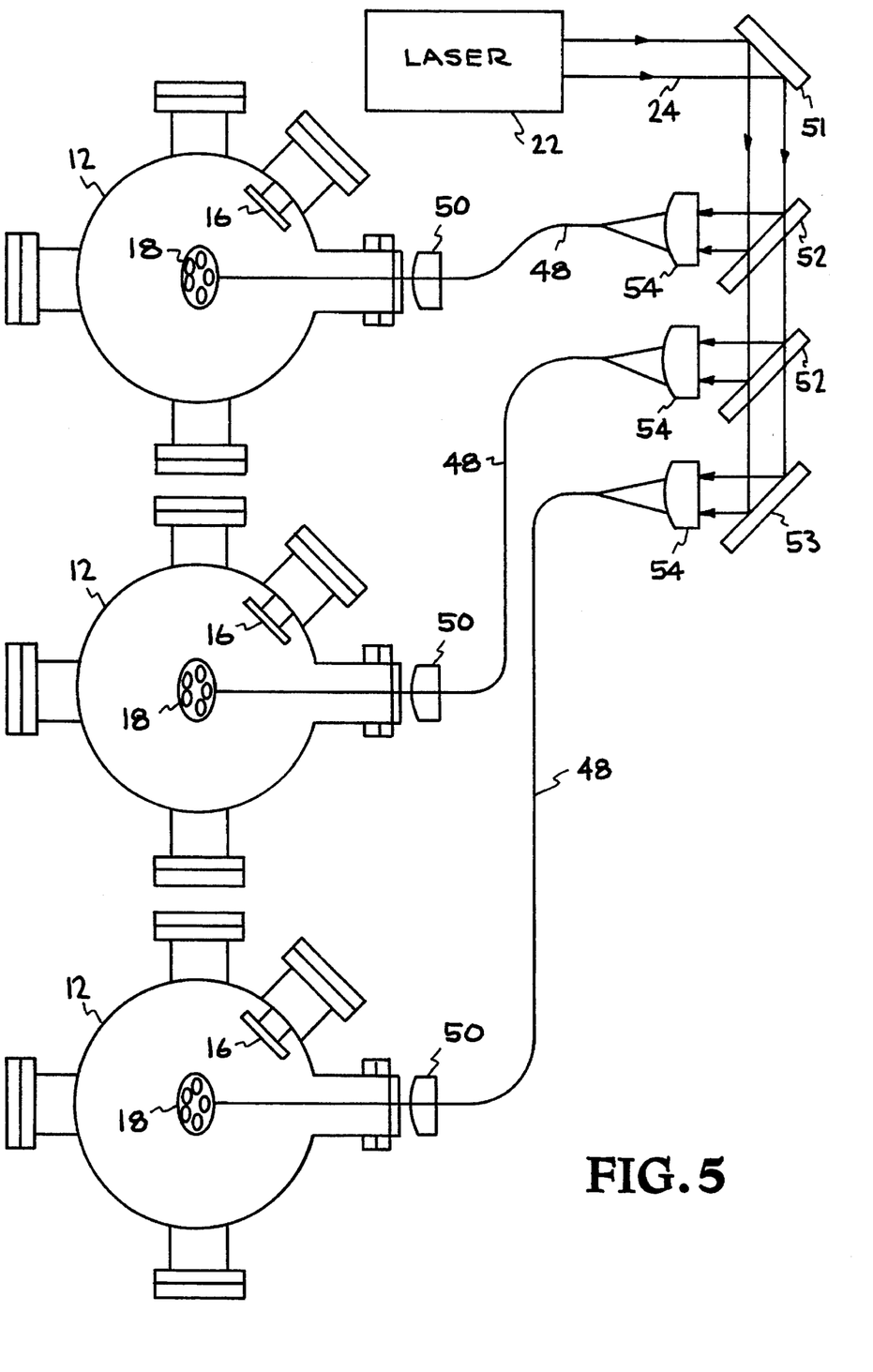
FIG. 5 is a schematic diagram of a fiber optic delivery system with multiple deposition chambers and a single laser source.

In FIG. 4, a single laser source 22 generates output beam 24. A highly reflective mirror 51 directs output beam 24 to beam splitters. Beam splitters 52 and a highly reflective mirror 53 launch fractions of output beam 24 into separate optical fibers 48 with the use of standard fiber injection optical elements 54. Three optical fibers 48 direct portions of output beam 24 into the same chamber 12, at different locations of target 18, or to a series of targets all within the same chamber. With multiple beams in the chamber 12 it is possible to deposit thin films over large surface areas at economically attractive rates. With multiple targets in the same chamber it is possible to create a thin film that is a mixture of materials, or multilayer films can be produced. Additionally, the three optical fibers 48 can direct portions of output beam 24 into three separate chambers 12, as illustrated in FIG. 5. Laser 22 can be operated uninterrupted even if one of the ablation processes in any one of the chambers stops. Final product can be removed from one chamber, while the others remain operating.

Figure 6:
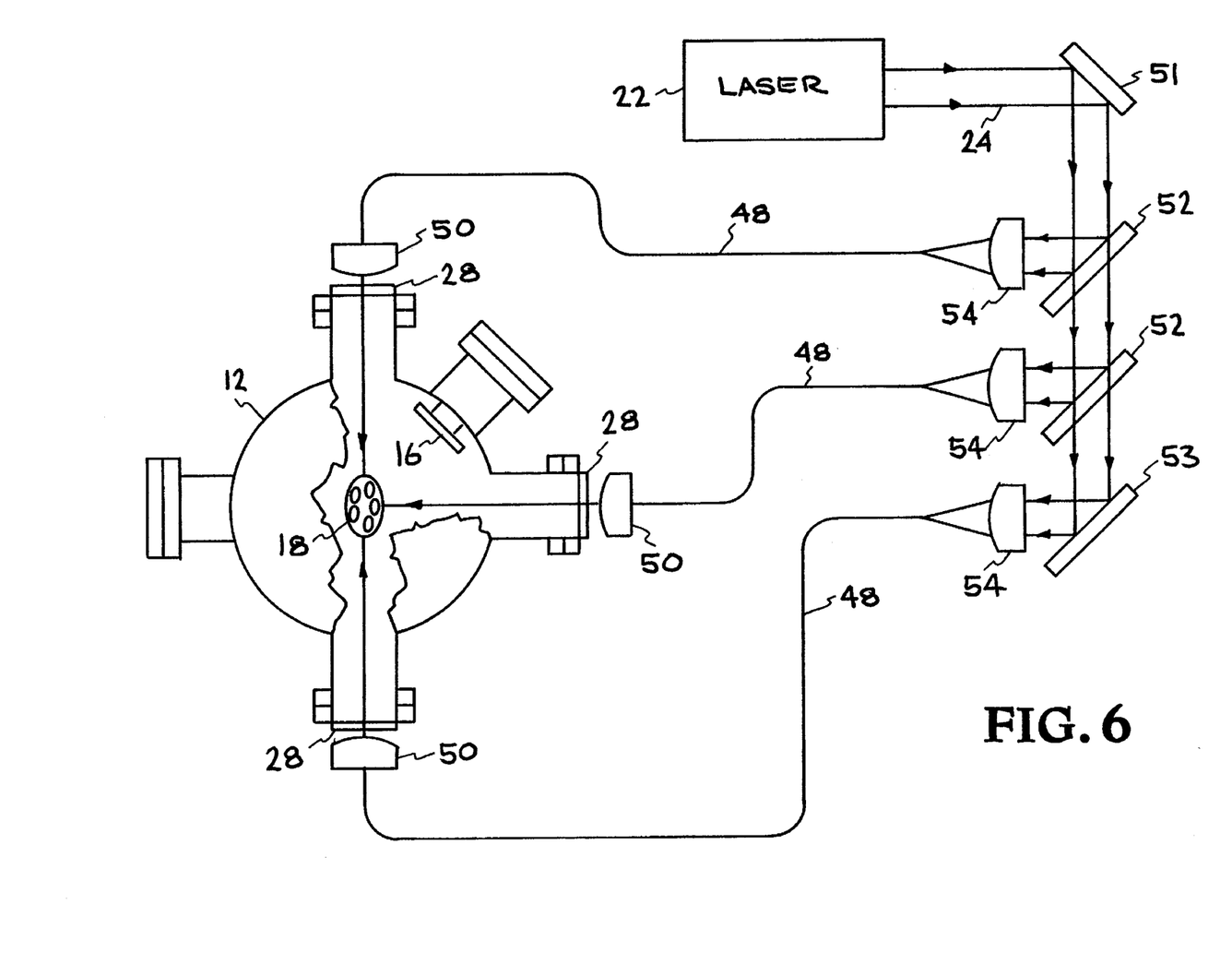
FIG. 6 is a schematic diagram of a fiber optic delivery system with a single laser source and a single deposition chamber with multiple input windows.
Figure 7:
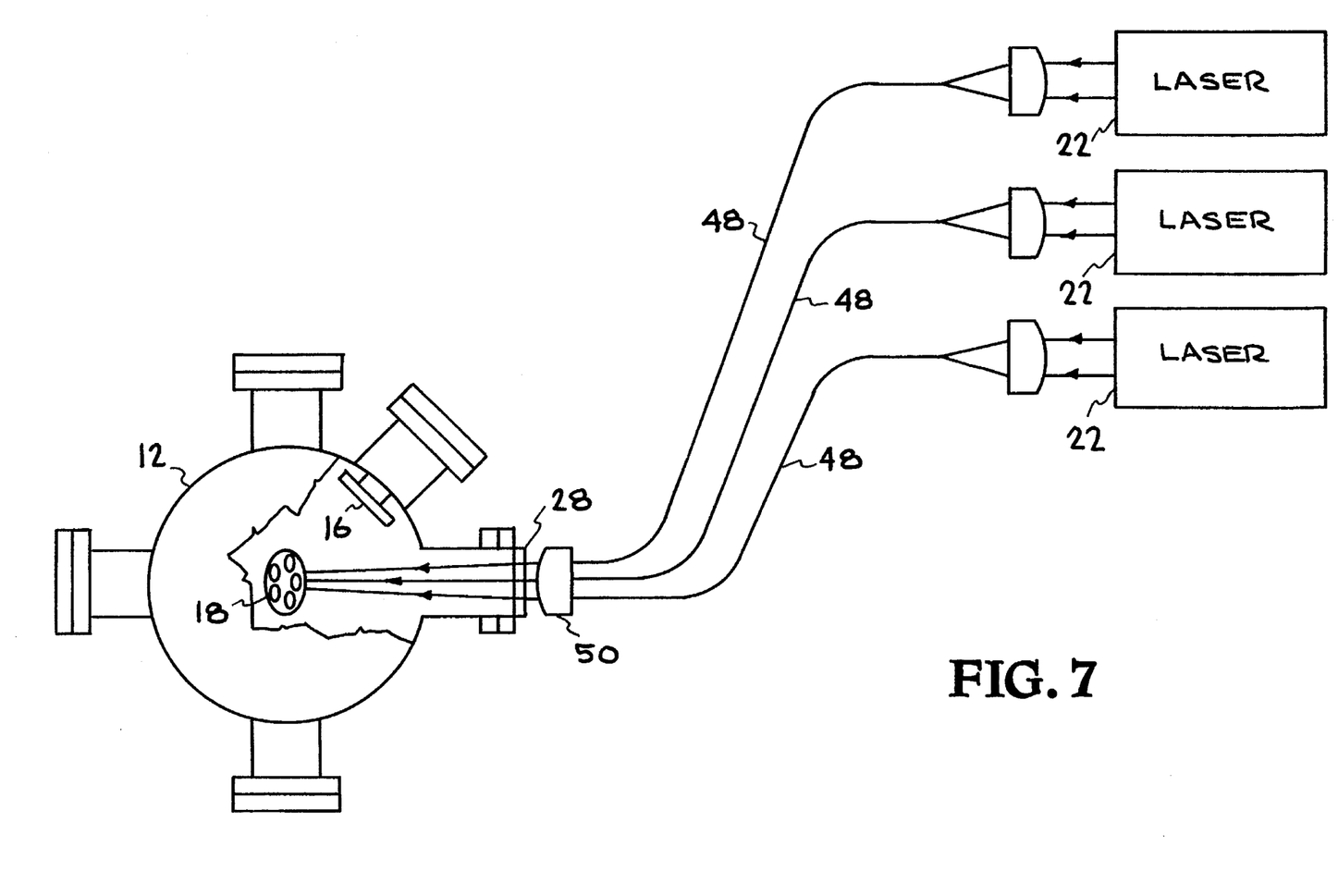
FIG. 7 is a schematic diagram of a fiber optic delivery system with a single deposition chamber and three laser sources.

A plurality of optical fibers 48 can be directed to a single chamber 12 that has multiple windows 28, as shown in FIG. 6. Multiple laser sources 22 can be coupled to multiple optical fibers 48 to deliver different output beams to one or more targets in a single chamber as illustrated in FIG. 7.

A wide variety of thin films can be created with the present invention. In one embodiment, diamond-like carbon (DLC) was made, as set forth in the following example.

FORMATION OF DLC THIN FILMS

A single copper vapor laser (CVL) oscillator and one (C-laser) amplifier of the LDF laser system operated for the Laser Materials Processing (LMP) facility at the Lawrence Livermore National Laboratory, Livermore, Calif., was used to produce DLC film with the following operating parameters:

| | |
|---|---|
| Wavelength | 510 nm, 578 nm (2:1) |
| Beam Size: | 50 to 300 µm |
| Power Density: | $2 \times 10^{10}$ to $4 \times 10^{8}$ W/cm$^2$ |
| Pulse Width: | 50 ns (FWHM) |
| Target Speed: | 8 cm/s |
| Target - Substrate Distance: | 7.6 cm |
| DLC Deposition Rate: | $5.6 \times 10^{-2}$ Å/pulse at $4 \times 10^{8}$ W/cm$^2$ |
| | $1.0 \times 10^{-3}$ Å/pulse at $2 \times 10^{10}$ W/cm$^2$ |

The optical delivery system was comprised of a discrete optics delivery system to transmit the beam and a single 500 mm focusing lens located adjacent to the vacuum deposition tank. Relatively low irradiance, $5 \times 10^{8}$ W/cm$^2$, was used on the target. The beam was defocused on the target.

The output beam was introduced through a fused silica window. The graphite target rod was 1 inch in diameter and mechanically rotated at approximately 1 RPS and could be manually moved axially to expose fresh (unilluminated) surfaces. POCO graphite (AXM-5Q grade) that was subjected to high temperature (2000° C.) treatments of flowing $F_2$ or $Cl_2$ gas to remove trace metal impurities was used. This level of pretreatment may not be required. The laser was aligned to strike the rod off center so that the laser plume was at 45 or 60 degrees to the incident beam. The substrate to be coated was mounted within a sample port that was easily removed for deposition on multiple substrates. A turbomolecular pump was used to achieve a base pressure of $5 \times 10^{-8}$ torr. For each set of deposition runs the vacuum chamber was heated up and outgassed. Typical vacuum levels during deposition episodes were in the $10^{-6}$ torr range. Assist or buffer gases were not used. A variety of substrates were used, including, $SiO_2$, Si, Si with Cr overlay, tool steel, WC and ZnS.

Because of DLC deposition on the fused silica window, input windows were extended from the chamber to a 330 mm standoff to decrease the window coating rate and thus increase their useful lifetime.

Figure 8:
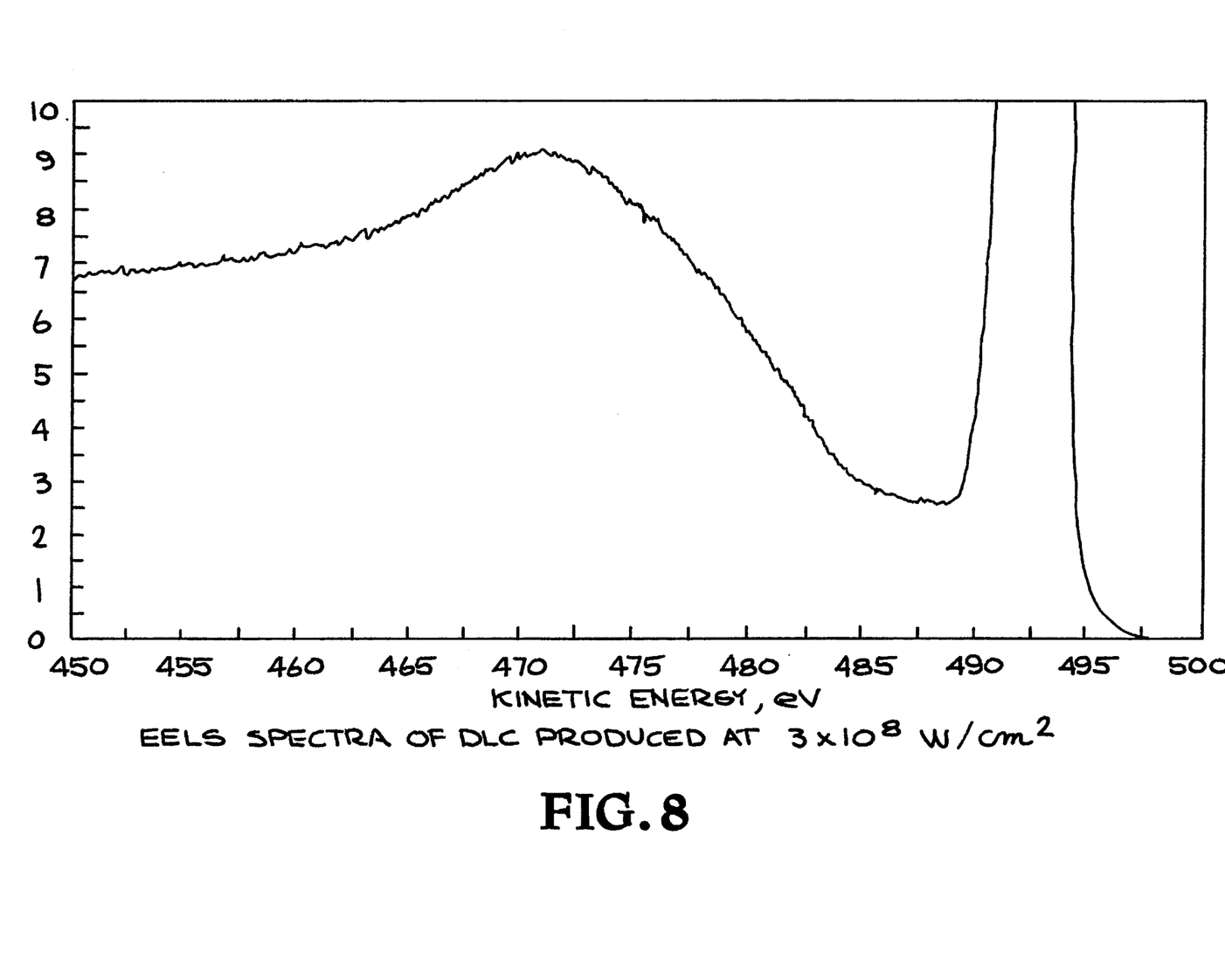
FIG. 8 is an EELS spectra of diamond-like-carbon produced by the method of the present invention.

Laser irradiance was varied between $3 \times 10^{8}$ W/cm$^2$ and $10^{10}$ W/cm$^2$. FIG. 8 is an electron energy loss spectrum for DLC material produced, and it indicates a lack of π-bond spectra associated with graphitic or glassy carbon.

Figure 9:
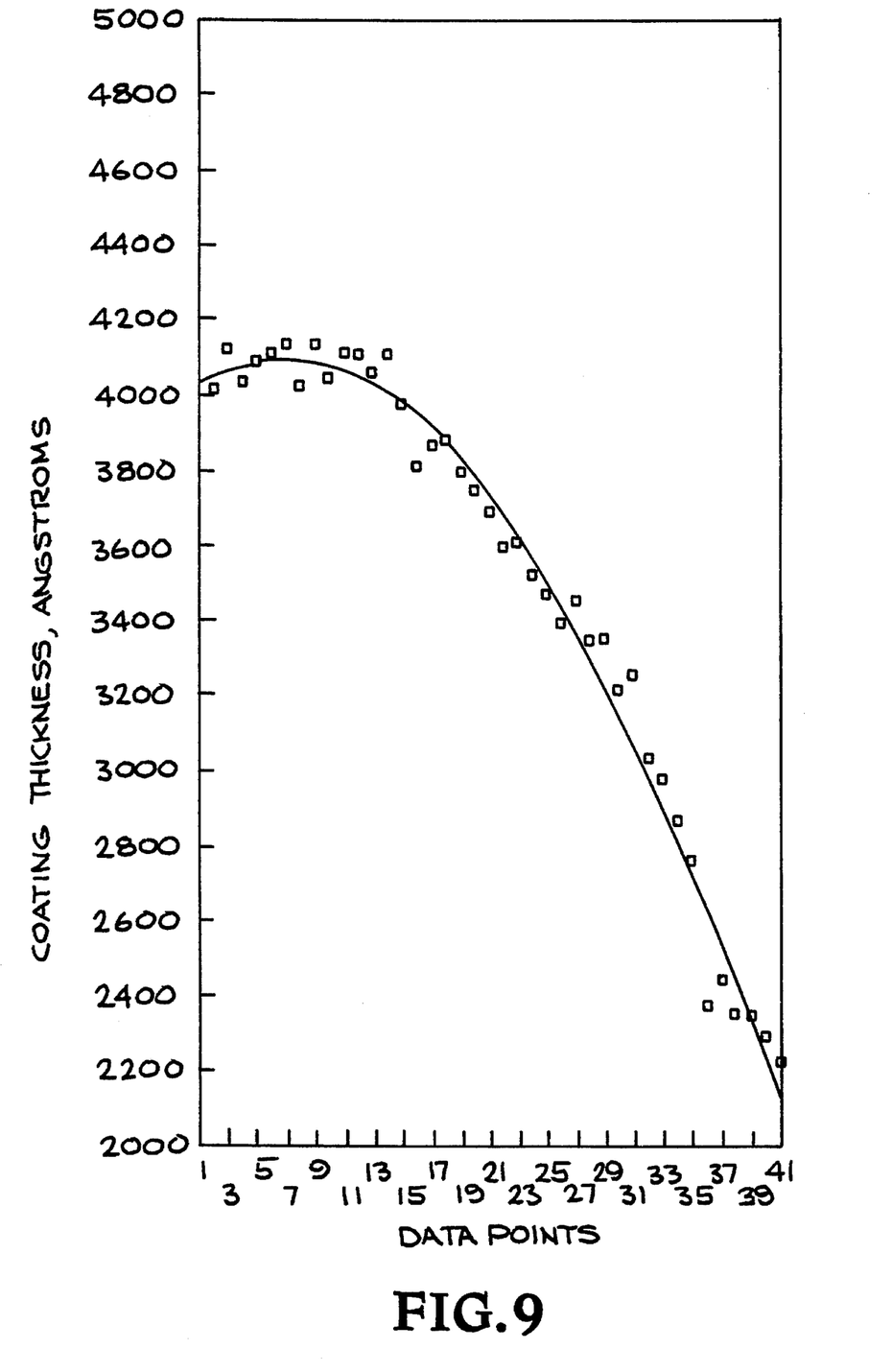
FIG. 9 is a deposition profile of measured diamond-like-carbon thickness across a substrate after 23 seconds of elapsed deposition time.

Silicon substrates were masked while both the target irradiance and number of laser pulses were controlled to quantify the volume of DLC grown. Spatial distribution and growth rate of the product film were determined by measuring film thickness as a function of position with a diamond stylus profilometer at the step-up provided by the masked area. FIG. 9 displays a measured DLC deposition thickness across the substrate.

The deposition profile in FIG. 9 was fit with a plume distribution proportional to $\cos^{10.5}(\emptyset)$ ($\emptyset$ . . . is the angle measured from the target surface normal). After $10^5$ laser pulses at $4 \times 10^{8}$ W/cm$^2$ (190 W average power) a thin film was achieved with 410 nm thickness at the center, with half thickness at a radius of ~4 cm. Because the copper laser operated at 4.4 kHz, $10^5$ pulses represented 23 seconds of elapsed time. Integrating the full volume of material and dividing by the elapsed time yielded an average deposition rate of $2 \times 10^{3}$ µm·cm$^2$/hr. DLC was also formed at 100 W average power at slightly lower target irradiance with a deposition of $2.6 \times 10^{3}$ µm·cm$^2$/hr.

Atomic force microscopy (AFM) was used to measure surface roughness. A 400 nm thick DLC film was determined to have a surface roughness, as measured by the AFM, of 3.6 nm.

There are a number of uses of DLC or crystalline diamond films including but not limited to low work function emitters for flat panel displays, hard low-friction coatings such as machine tool bits or infrared optics, corrosion resistant coatings for chemical processing systems, and heat spreading coatings for the electronics industry.

A wide variety of thin films can be produced using the present invention. Suitable materials that can be coated by pulsed laser deposition by the present invention, and their applications, include, but are not limited to,: $BaFe_{16}O_{19}$-high density hard disk coatings; $BaTiO_3$—optical coatings; cubic BN—high temperature, radiation resistant semiconductors, cutting tool coatings; amorphous C—tribological coatings, heat sinks and field emitters for FPD's; $Cd_x$; $Zr_{1-x}Te$—Infrared detectors; $CoSi_2$—low resistivity interconnects for fast switching Schottky rectifiers; $MoS_2$—high resistivity lubricating coating; $NdSe_2$—low resistivity lubricating coating; $Pb(Zr_{0.54}Ti_{0.46})O_3$—piezoelectric devices, nonvolatile memory; SiC—high temperature, wide band gap semiconductors; $TiO_2$—antireflection coatings; $YBa_2Cu_3O_7$—high Tc superconductors; and ZnO—piezoelectric devices and phosphors.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An apparatus for producing a thin film of a target material on a substrate, comprising:
   a laser source producing a visible output beam;
   a chamber;
   a fiber optic delivery system including a distal end coupled to the laser source, and a proximal end positioned adjacent to the chamber to deliver the output beam to the target material in the chamber;
   a target support positioned in the chamber; and
   a substrate support positioned in the chamber.

2. The apparatus of claim 1, wherein the laser source produces a pulsed visible output beam at a high pulse repetition frequency.

3. The apparatus of claim 1, further comprising a window in the chamber with the proximal end of the fiber optic positioned adjacent to the window.

4. The apparatus of claim 3, further comprising a window protection device positioned in the chamber to minimize deposition of ionized target material on the window.

5. The apparatus of claim 4, wherein the window protection device is a roll of transparent protection sheet material that extends across the window in the chamber, and advances periodically to introduce a new sheet of material across the window.

6. The apparatus of claim 1 comprising a substrate support having means for heating or cooling said substrate.

7. The apparatus of claim 1, wherein the proximal end of the fiber optic is at least partially positioned in the chamber.

8. The apparatus of claim 1, further comprising a device for creating a vacuum in the chamber.

9. The apparatus of claim 1, further comprising a focus element positioned adjacent to the proximal end of the fiber optic to direct the output beam to a desired site on the target material.

10. The apparatus of claim 1, further comprising a device to angularly more the output beam as it impinges on the target material.

11. The apparatus of claim 1, wherein the fiber optic is made of a material that transmits visible light.

12. The apparatus of claim 1, wherein the fiber optic is made of fused silica.

13. The apparatus of claim 1, wherein the target support is a rotating spindle.

14. The apparatus of claim 1, wherein the target support is a rotatable platform for retaining multiple samples of target material.

15. The apparatus of claim 14, wherein the target support includes a device to rotate each of the samples while it is on the rotatable platform when the output beam is incident on the sample.

16. The apparatus of claim 1, further comprising;
    a reactive atomic or molecular beam source that produces a reactive beam; and
    a device to direct the reactive beam to the thin film on the substrate.

17. The apparatus of claim 16, further comprising a device to pulse the reactive beam.

18. The apparatus of claim 16, further comprising a discharge generator positioned in the chamber in a path of the reactive beam.

19. The apparatus of claim 1, further comprising a device to bias the substrate support continuously or in a pulsed manner.

20. An apparatus for producing a thin film of a target material on a substrate, comprising:
    a laser source producing a visible output beam;
    a chamber;
    a beam splitting device positioned to receive the output beam and split its output into a plurality of output beams;
    a plurality of fiber optic devices, each fiber optic device having a distal end coupled to the beam splitting device to receive one of the plurality of output beams, and a proximal end positioned adjacent to the chamber and deliver its output beam to the chamber;
    a target support positioned in the chamber; and
    a substrate support positioned in the chamber.

21. The apparatus of claim 20 wherein each fiber optic device delivers its output beam to a different site of the target in the chamber.

22. The apparatus of claim 20, further comprising a plurality of target materials each supported on a different target support in the chamber.

23. The apparatus of claim 20, wherein the laser source produces a pulsed visible output beam at a high pulse repetition frequency.

24. The apparatus of claim 20, further comprising a window in the chamber with the proximal end of each fiber optic device being positioned adjacent to the window.

25. The apparatus of claim 20, further comprising a plurality of windows in the chamber with the proximal end of each fiber optic device being positioned adjacent to a window.

26. The apparatus of claim 20, wherein each proximal end of the fiber optic device is at least partially positioned in the chamber.

27. The apparatus of claim 20, further comprising a device for creating a vacuum in the chamber.

28. The apparatus of claim 20, further comprising a focus element positioned adjacent to each proximal end of the fiber optic devices to direct the output beams to desired sites on the target material.

29. The apparatus of claim 20, further comprising a plurality of focus elements each positioned adjacent to a proximal end of each fiber optic device to direct its output beam to a desired site in the chamber.

30. The apparatus of claim 20, further comprising a plurality of chambers each associated with a single fiber optic device.

31. The apparatus of claim 20, wherein each fiber optic device is made of a material that transmits visible light.

32. The apparatus of claim 31 wherein each fiber optic device is made of fused silica.

33. The apparatus of claim 20, wherein the target support is a rotating spindle.

34. The apparatus of claim 20, wherein the target support is a rotatable platform for retaining multiple samples of target material.

35. The apparatus of claim 34, wherein the target support includes a device to rotate each of the samples while it is on the rotatable platform when an output beam is incident on the sample.

36. The apparatus of claim 20, further comprising:
   a reactive atomic or molecular beam source that produces a reactive beam; and
   a device to direct the reactive beam to the thin film on the substrate.

37. The apparatus of claim 36, further comprising, a device to pulse the reactive beam.

38. The apparatus of claim 20, further comprising a discharge generator positioned in the chamber in a path of the reactive beam.

39. The apparatus of claim 20, further comprising a device to bias the substrate support continuously or in a pulsed manner.

40. An apparatus for producing a thin film of a target material on a substrate, comprising:
   a chamber;
   a plurality of laser sources, each producing a visible output beam;
   a plurality of fiber optic devices, each fiber optic device having a distal end coupled to a laser source, and a proximal end positioned adjacent to the chamber to deliver a visible output beam to a separate site on the target material in the chamber;
   a target support device positioned in the chamber; and
   a substrate support device positioned in the chamber.

41. The apparatus of claim 40, wherein each laser source produces a pulsed visible output beam at a high pulse repetition frequency.

42. The apparatus of claim 40, further comprising a window in the chamber with the proximal end of each fiber optic device positioned adjacent to the window.

43. The apparatus of claim 42, further comprising a window protection device positioned in the chamber to minimize deposition of ionized target material on the window.

44. The apparatus of claim 40, wherein each proximal end of each fiber optic device is at least partially positioned in the chamber.

45. The apparatus of claim 40, further comprising a device for creating a vacuum in the chamber.

46. The apparatus of claim 40, further comprising a focus element positioned adjacent to the proximal ends of the fiber optic devices to direct their output beams to desired sites on the target material.

47. The apparatus of claim 40, wherein each fiber optic is made of a material that transmits visible light.

48. The apparatus of claim 40, wherein each fiber optic device is made of fused silica.

49. The apparatus of claim 40, wherein the target support is a rotating spindle.

50. The apparatus of claim 40, wherein the target support device is a rotatable platform for retaining multiple samples of target material.

51. The apparatus of claim 50, wherein the target support device includes a device to rotate each of the samples while it is on the rotatable platform when an output beam is incident on the sample.

52. The apparatus of claim 40, further comprising:
   a reactive atomic or molecular beam source that produces a reactive beam; and
   a device to direct the reactive beam to the thin film on the substrate.

53. The apparatus of claim 40, further comprising a device to pulse the reactive beam.

54. The apparatus of claim 40, further comprising a discharge generator positioned in the chamber in a path of the reactive beam.

55. The apparatus of claim 40, further comprising a device to bias the substrate support continuously or in a pulsed manner.

56. The apparatus of claim 40, comprising a plurality of chambers, each associated with a proximal end of a fiber optic device.

* * * * *